(12) United States Patent
Eriksson

(10) Patent No.: US 6,255,829 B1
(45) Date of Patent: Jul. 3, 2001

(54) APPARATUS FOR FUNCTION TESTING OF SENSORS IN HIGH VOLTAGE DEVICES

(75) Inventor: Mats Eriksson, Norsjö (SE)

(73) Assignee: Elkonsulten AB (SE)

( * ) Notice: Subject to any disclaimer, the term of this patent is extended or adjusted under 35 U.S.C. 154(b) by 0 days.

(21) Appl. No.: 09/392,235

(22) Filed: Sep. 8, 1999

(30) Foreign Application Priority Data

Oct. 5, 1998 (SE) .................................................. 9803364

(51) Int. Cl.[7] .................................................. G01R 31/00
(52) U.S. Cl. ........................ 324/602; 324/556; 324/414
(58) Field of Search ..................................... 324/602, 536, 324/557, 520, 501, 414, 556

(56) References Cited

U.S. PATENT DOCUMENTS

| | | | |
|---|---|---|---|
| 4,410,091 | * 10/1983 | Cowlin et al. ........................ | 209/546 |
| 4,562,832 | * 1/1986 | Wilder et al. ........................... | 128/20 |
| 4,621,618 | * 11/1986 | Omagari ..................................... | 128/6 |
| 4,702,553 | * 10/1987 | Buchmuller et al. ............. | 350/96.29 |
| 4,941,456 | * 7/1990 | Wood et al. ............................... | 128/6 |
| 5,115,382 | * 5/1992 | Smith ................................... | 362/105 |

* cited by examiner

Primary Examiner—Safet Metjahic
Assistant Examiner—T. R. Sundaram
(74) Attorney, Agent, or Firm—Fasth Law Offices; Rolf Fasth

(57) ABSTRACT

The device may be used to, for example, function test sensors in high voltage plants and signal boxes. The device makes it possible to function test sensors in high voltage plants, independent of where the sensors are located. The elongated device has one end that is provided with an insulated handle part and a flexible component that has a light generating part at an outer end thereof. The light generating part emits a light that is similar to the light of an electric arc.

6 Claims, 1 Drawing Sheet

APPARATUS FOR FUNCTION TESTING OF SENSORS IN HIGH VOLTAGE DEVICES

TECHNICAL FIELD

This present invention contemplate a device performance test of sensors in high voltage plants, for instance in all-electric interlocking apparatus.

BACKGROUND AND SUMMARY OF THE INVENTION

Sometimes in high voltage plants, electric arcs can appear, which commonly form in electronic discharges, between high-tension electric conductors. Those electric arcs are in a great measure pernicious to the surrounding equipment and perilous to the individuals that sojourn in the plant. Today those high voltage plants are equipped with sensors that respond to the occurring electric arcs and that can be connected to recorders, alarm devices and safety equipment. The sensors are composed of photo diodes that respond to the light the occur in the electronic discharge. This means that the sensors respond to the actual electric arc. The sensors is to be had in an amount of different designs and many of them are equipped with contrivance that makes it possible to spatially respond to where the electric arc has developed.

The sensors are always put out at inaccessible places near the high tension leading parts. The security in high voltage plants are highly dependent of the sensors and that those are working. To make the best of the security in the high voltage plants equipped with stationary sensors to respond to appearance of electric arcs, the function of the sensors must be controlled regularly. This is best done by imitating the light of an electric arc near a sensor and verify that the sensor respond to it and sends information to recorders, alarm devices and safety equipment, if there are any. There are devices that are installed stationary near every sensor and that uses pulsating laser to obtain a stimulated electric arc that the sensors respond to. These are often expensive since it is required one control near each sensor. Furthermore the work of maintenance increases, and with that the expenses since not only the function of the sensors has to be controlled but also the safety equipment needs to be checked regularly. There is a big need of a construction that makes it possible to use only one device to do the function test of a number of different sensors, by locating the device in a satisfying position by every sensor in a simple, safe and inexpensive way.

One purpose with the mentioned invention is thereby to offer an device that makes it possible to do function tests of sensors in high voltage plants independent of where or how the sensors are located.

This purpose is achieved since the device according to the invention proves the distinctive feature that mentions in the distinctive part of the patent.

DETAILED DESCRIPTION

Figure 1:
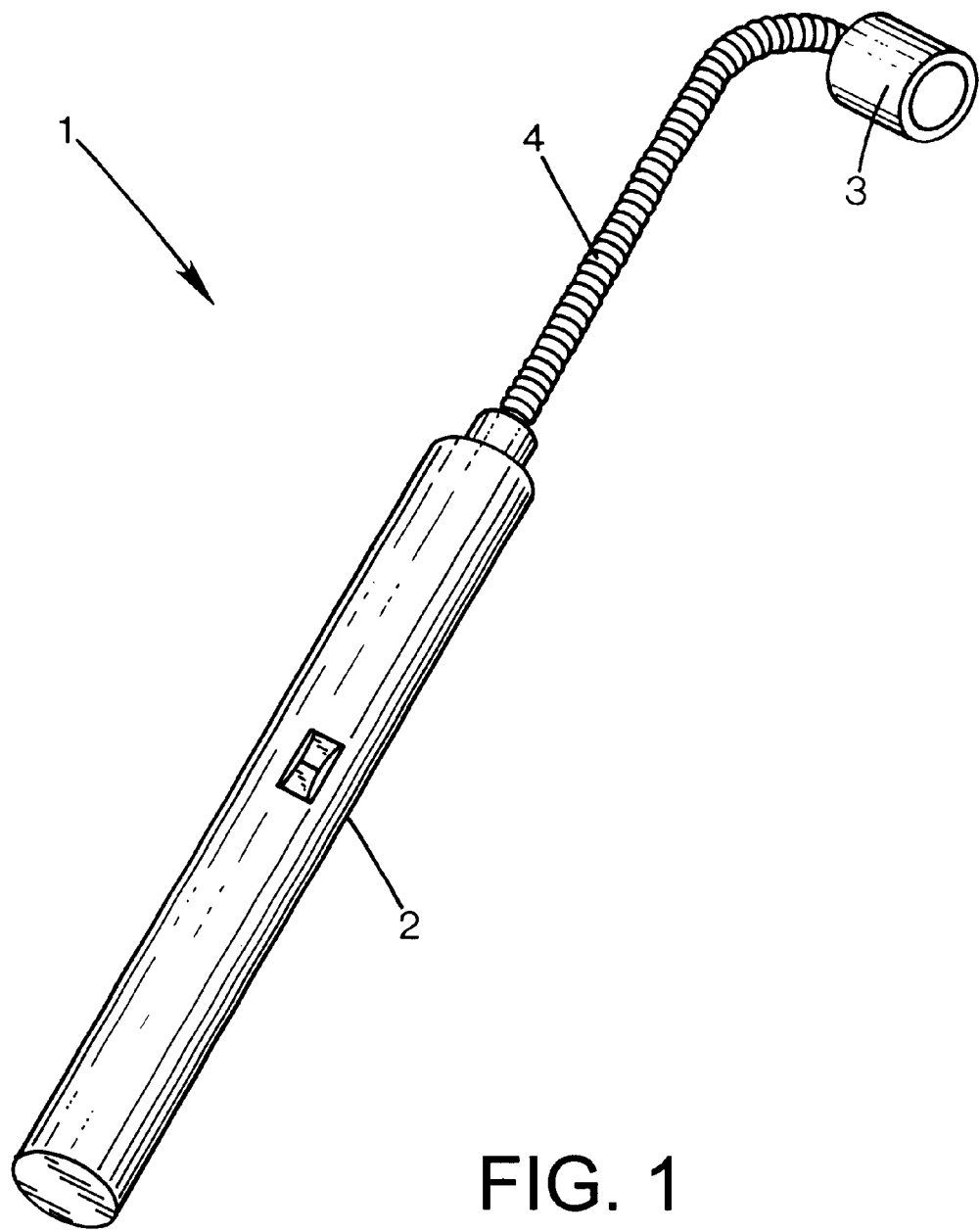
FIG. 1 is a prespective view of the test instrument of the present invention.

Different design of the device according to the invention are described below with reference to the enclosed drawing, in the drawing a perspective view is shown of a device that according to the invention is provided with a bendable part. The device that is shown on the drawing consist of a elongated constituent 1 that on one side is provided with an insulated part 2 and that on its other side is provided with a light generating unit 3. The light generating unit 3 of the device is connected to a driving gear with belonging controls and regulators. The elongated constituent 1 is provided with an adjustable part and constitute the nucleus of the device and gives it its main form and is by advantage constructed in one part but can also be constructed by different parts that are connected. Constituent 1 is by advantage made of material that is insulating. The elongated constituent 1 is best done provided with a least one adjustable part 4 which makes it possible for the user to aim the light generating device 3 to the exact position next to a sensor and thereby make the function test safer. The adjustable part 4 is located anywhere along the elongated constituent 1 but most functional is to locate the adjustable part 4 by the front end of the device that is provided with the light generating device 3. It is of course possible to have more than one adjustable part. If the elongated constituent 1 is made of different parts that are connected, one or some parts can be adjustable. It is also possible to combine the different parts flexible, revolvable or tumble links. It is suitable to construct the adjustable part 4 in a way that makes it possible to move in many degrees of freedom. One proposed construction is that the adjustable part 4 consist of one flexing part of the elongated constituent 1. The flexible part is suitably made of a linksystem covered with rubber. The insulated part 2 in the end of the elongated constituent 1 is mainly a handle part for holding and controlling the device and is mainly stiff. Since the handle is insulated, working with the device in high voltage plants gets safer. The handle part 2 should be made of material that not only is insulated but also possible to form in different ways to make the handle easy to hold and that is ergonomically satisfying, like rubber or polymer material. The handle part 2 can be designed to make room for two hands, that makes it possible to hold and aim the device in a stabile way, especially if the device is long. The elongated constituent 1 can be provided with more insulated parts 2 located in the longitudinal direction to offer further holding possibilities. The other end of the elongated constituent 1 is provided with a light generating part 3 that contains a flashlight, laser transmitter or other known light sources that emits a light that the sensors will react to. It is important that the light that is emitted is aimed in a controlled way to make the right sensor respond. It is convenient to make this with help of reflectors, slits, lenses or other devices that can control light waves in wanted directions and that arranges in connection with the light generating part 3. The light generating part 3 may emit a flashing light or a laser light. The part 3 is preferably adjustable, twistable, revolvable, flexible or similar. The part 3 is best made in material that does not interfere with the components that exists in high voltage plants. It's suitable made of insulating material. The light generating part 3 has got an exterior form that has been minimized to its size, that has been adjusted to it's range of application and that also has been adjusted in form on the light source that is used. The light generating part 3 contains a drive with belonging controlling and steering device that advisably is put in the elongated constituent 1. The elongated constituent 1 can be described as a handle with holes in it. To balance the weight of the device it's advisably to put the drive in or nearby the handle part 2. The drive can preferably be composed of a battery. The switch, activating organ to the light generating part and other controls are easily accessible nearby the handle 2. The device is preferably telescoping in a part to make it possible to change the length. The device is in that case provided with telescopically shiftable parts that preferably can be located in or near the insulated handle part 2.

The device is also preferably provided with a switch mechanism, not shown in the drawing.

The device is used like this:

The device is carried by the user and can mainly be hold on the insulated handle part 2. The light generating part 3 is located within the reaction area of a sensor. If the sensors are located in inaccessible places, the location of the devices light generating part 3 will be facilitated since the elongated constituent 1 has got one or several arts that are adjustable by bending or/and telescoping. When the light generating part 3 is located in the right position it is activated and emits a light that is similar to the light of an electric arc. The user can control the respond of the sensor and also control other possible signals that should have been passed along.

What is claimed is:

1. A method of testing a sensor in a high voltage plant, comprising:
    (a) providing a testing device comprising an electrically insulated handle, a flexible component having a first end attached to the handle, a light emitting unit attached to a second opposite end of the flexible component and connected to a driving device;
    (b) positioning the light emitting unit adjacent to a high voltage sensor and aiming the light emitting unit towards the sensor;
    (c) the light emitting unit emitting an electric arc light on the sensor; and
    (d) analyzing a response of the sensor to the electric arc light to determine whether the sensor functions.

2. The method according to claim 1 wherein the method further comprises positioning the light emitting unit adjacent to the sensor by adjusting a shape of the flexible component.

3. The method according to claim 2 wherein the step of adjusting comprises bending the flexible component.

4. The method according to claim 1 wherein method further comprises adjusting a length of the device with a telescoping part.

5. The method according to claim 1 wherein step (c) further comprises emitting a flashing light.

6. The method according to claim 1 wherein step (c) further comprises emitting a laser light.

* * * * *